United States Patent [19]

Ono et al.

[11] Patent Number: 5,581,223
[45] Date of Patent: Dec. 3, 1996

[54] SUPERCONDUCTING MAGNET

[75] Inventors: Haruo Ono; Michiru Fujita, both of Kanagawa, Japan

[73] Assignee: Fuji Electric Co., Ltd., Kanagawa, Japan

[21] Appl. No.: 305,219

[22] Filed: Feb. 2, 1989

[30] Foreign Application Priority Data

Feb. 3, 1988 [JP] Japan .................................. 63-23394
Nov. 15, 1988 [JP] Japan .................................. 63-287898

[51] Int. Cl.⁶ ...................................................... H01F 7/00
[52] U.S. Cl. ............................ 335/301; 335/216; 324/318
[58] Field of Search ................................. 335/216, 299, 335/301, 304; 324/318, 319, 320

[56] References Cited

U.S. PATENT DOCUMENTS 4,797,646 1/1989 Saji et al. .............................. 335/216
4,803,452 2/1989 Saji et al. .............................. 335/216

FOREIGN PATENT DOCUMENTS

0138270 4/1985 European Pat. Off. ............... 335/301
60-217608 10/1985 Japan .
260116 10/1988 Japan .................................... 335/301

*Primary Examiner*—George Harris
*Attorney, Agent, or Firm*—Finnegan, Henderson, Farabow, Garrett and Dunner

[57] ABSTRACT

A superconducting magnet for producing a uniform magnetic field, including a main coil comprising first superconducting coils, and active shield comprising second superconducting coils and arranged in such a manner as to coaxially surround the main coil, and a self-shield comprising magnetic material and arranged in such a manner as to coaxially surround the active shield. The magnetic moment of the active shield is smaller in absolute value than and opposite in direction to the magnetic moment of the main coil.

6 Claims, 5 Drawing Sheets

SUPERCONDUCTING MAGNET

BACKGROUND OF THE INVENTION

This invention relates to a magnetic field coil forming an at least approximately uniform magnetic field in the space in a cylindrical coil, and more particularly to a superconducting magnet for a nuclear magnetic resonance imaging apparatus providing a high magnetic field (hereinafter referred to as "an MRI apparatus", when applicable).

A superconducting magnet for an MRI apparatus comprises: a cylindrical coil or a plurality of ring-shaped coils about 1 m in diameter for receiving therein the human body to be examined; and, when necessary, a magnetic shield made of magnetic material such as steel which is arranged outside the coils and absorbs the leakage flux of the coils. In order to obtain a tomogram of the human body, it is required that the strength of the magnetic field in the coils in which the human body is laid is uniform with a tolerance of $\frac{1}{1,000,000}$ or less. In order to obtain the strength of the magnetic field and the uniformity in strength, heretofore the following method is employed: A uniform magnetic field coil is formed by coaxially arranging a plurality of ring-shaped coils so that, when current flows therein, the magnetic field formed thereby is most uniform in strength.

However, the uniform magnetic field coil thus formed is disadvantageous in that the uniform magnetic field formed thereby leaks out. That is, the leakage magnetic field causes electronic equipment around the magnet to operate erroneously, and distorts the magnetic field of a ferromagnetic element near the MRI apparatus, whereby the uniform magnetic field is adversely affected. Thus, although the uniform magnetic field coil itself can form the uniform magnetic field, when it is singly used with the MRI apparatus the magnetic field uniformity is not so high as expected.

In order to eliminate the above-described difficulty attributing to the leakage magnetic field, a method has been employed in which a magnetic shield is provided outside the uniform magnetic field coil.

Figure 7:
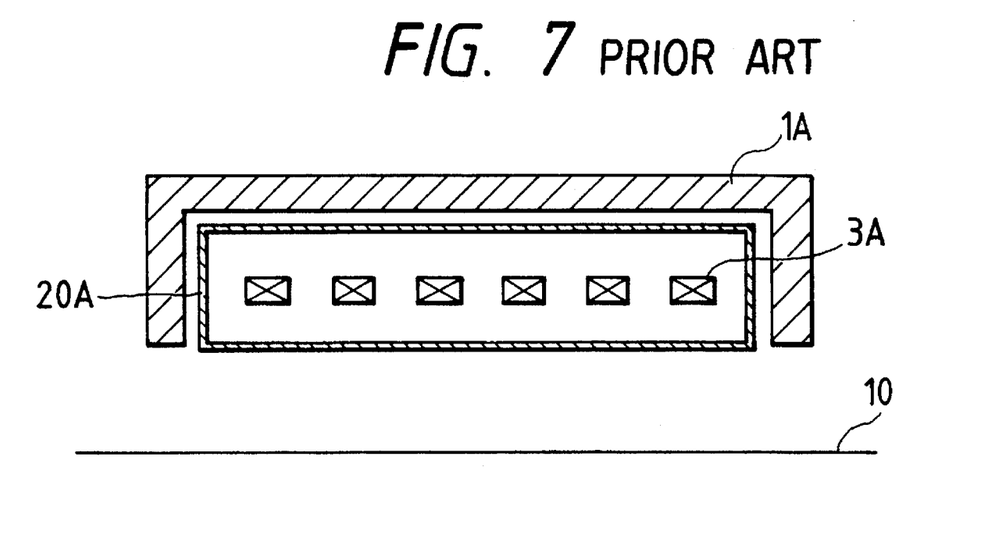
FIGS. 7 and 8 are sectional views showing examples of a conventional superconducting magnets.

The magnetic shield is shown in FIG. 7. The magnetic shield comprises a cylinder made of magnetic material such as steel, and it is provided outside a cryostat 20A. The cryostat 20A accommodates a main coil 3A comprising superconducting coils. The magnetic shield is referred to as "a self-shield". The self-shield absorbs the leakage magnetic field of the main coil 3A. This method is applied not only to a superconducting magnet but also an MRI magnet using conducting coils. The method suffers from the following difficulty: Since in the case of an MRI apparatus providing a high uniform magnetic field strength, the leakage magnetic field is large, the self-shield made of steel is considerably large in weight, so that the room where the MRI apparatus is installed may be insufficient in mechanical strength.

Figure 8:
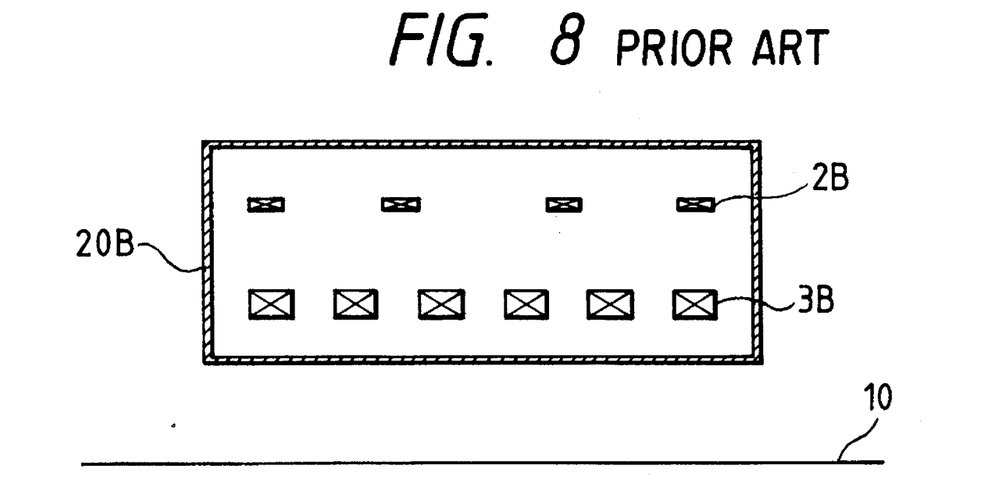

In order to eliminate the above-described difficulty accompanying the employment of a magnetic shield of ferromagnetic material for a superconducting magnet, a method has been employed in which, as shown in FIG. 8, the leakage magnetic flux is cancelled with a superconducting coil which is the same as the main coil. In FIG. 8, reference character 3B designates the main coil; and 2B, the superconducting coil which is accommodated in the same cryostat 20B as the main coil 3B. The superconducting coil 2B is referred to as "an active shield".

When the magnetic moment of the active shield 2B is made equal in absolute value to and opposite in direction to that of the main coil, then the leakage magnetic field can be ideally cancelled out (cf. Japanese Patent Application (OPI) No. 217608/1985 (the term "OPI" means an "unexamined published application")). On the other hand, the magnetic flux density of the uniform magnetic field space induced by the active shield 2B is opposite in direction to the magnetic flux density of the uniform magnetic field induced by the main coil 3B, and therefore the magnetic flux density of the uniform magnetic field which is the composite of these two magnetic flux densities is smaller than that of the uniform magnetic field provided when only the main coil is employed. In order to complement the reduction of the magnetic field density, it is necessary to increase the ampere turn of the main coil 3, and accordingly the quantity in use of superconducting wire is increased not only for the active shield 2B but also for the main coil 3B.

The above-described method of using as the magnetic shield the active shield comprising the superconducting coil is advantageous in the following point: The leakage magnetic field can be cancelled out without use of a magnetic material, and therefore the uniform magnetic field space of the magnetic material near the MRI apparatus is scarcely affected, with the result that a magnetic field analysis necessary for designing a uniform magnetic field coil can be readily achieved. Thus, the method is effective in designing a superconducting magnet for the MRI apparatus in which the magnetic field space must be considerably high in uniformity. The above-described superconducting MRI apparatus magnet in which the leakage magnetic field is cancelled with the same superconducting coil as the uniform magnetic field coil is referred to as "an active shield type superconducting MRI apparatus magnet". The above-described system is advantageous in that, since no magnet material such as steel is employed, the weight is light, and installation of the MRI apparatus is free from the load limit of the floor. However, it is still disadvantageous in the following points: When compared with the self-shield type superconducting magnet as shown in FIG. 7, the quantity of superconducting wire used for formation of the superconducting coil is large. Since superconducting wire is much higher in cost than steel, the superconducting magnet is higher in manufacturing cost than the self-shield type superconducting magnet, although the former is smaller in size than the latter.

If, in the case when a superconducting MRI apparatus is installed in the room, the total weight of the superconducting magnet determined from the load limit of the floor of the room is excessively large because of the employment of the self-shield as the magnetic shield, then it is necessary to employ the active shield. However, in this case, the superconducting magnet high in manufacturing cost must be used, and the MRI apparatus high in manufacturing cost must be employed.

SUMMARY OF THE INVENTION

An object of this invention is to provide, in the case where the self-shield type superconducting magnet lower in manufacturing cost can be employed because the total weight of a superconducting magnet is limited by the load limit of the floor on which an MRI apparatus is to be installed, a superconducting magnet lower which is within the weight limit and lowest in manufacturing cost.

The foregoing object of the invention is achieved by the provision of a superconducting magnet which, according to the invention, comprises: a main coil including superconducting coils arranged symmetrically with axis; an active shield including superconducting coils arranged in such a manner that the active shield is coaxial with the main coil, surrounding the main coil; and a self-shield comprising a cylinder of magnetic material, the self-shield being arranged in such a manner that the cylinder is coaxial with the active shield, surrounding the active shield, and the magnetic moment of the active shield being smaller in absolute value than and opposite in direction to the magnetic moment of the main coil.

In the superconducting magnet of the invention, a part of the leakage magnetic field induced by the main coil is cancelled by the active shield comprising superconducting coils, and the remaining is absorbed by the self-shield; that is, two different magnetic shields are employed. More specifically, under the condition that the weight of the superconducting magnet is within the limit value in total weight which is determined from the load limit of the floor on which the MRI apparatus is to be installed, the absorption of the leakage magnetic field by the self-shield type magnetic shield is made maximum, and the remaining leakage magnetic field is cancelled by the active shield.

PREFERRED EMBODIMENTS OF THE INVENTION

A preferred embodiment of this invention will be described with reference to the accompanying drawings.

Figure 1:
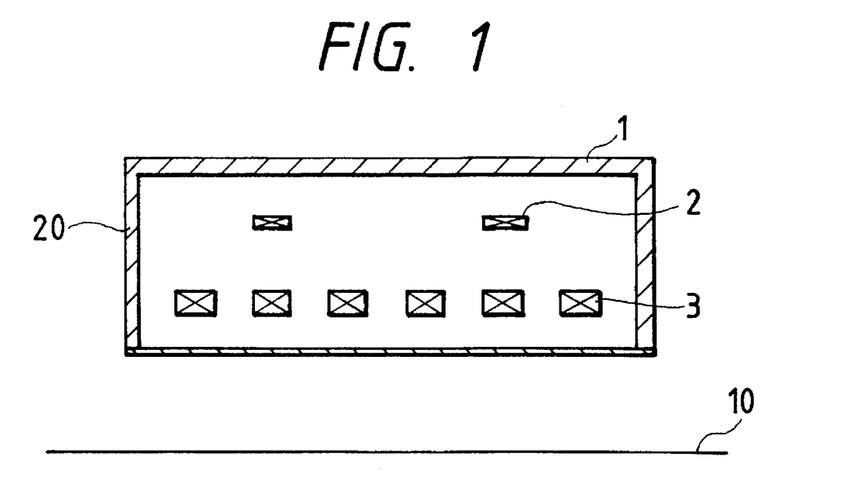
FIG. 1 is a sectional view showing one example of a superconducting magnet according to this invention.

FIG. 1 is a sectional view of the embodiment of the invention. In FIG. 1, reference numeral 1 designates a self-shield; 2, an active shield; 3, a main coil for inducing a uniform magnetic field; 20, a cryostat accommodating the main coil 3 and the active shield 2; and 10, the axis of symmetry.

A part of the magnetic flux of the uniform magnetic field may leak out of the main coil 3; however, it is absorbed mainly by the self-shield 1. On the other hand, the active shield forms a magnetic field which is superposed on the magnetic field induced by the main coil 3.

In this case, the magnetic moment of the active shield 2 causes current to flow in a superconducting coil forming the active shield so that the magnetic moment of the active shield 2 is opposite to that of the main coil 3. Therefore, the magnetic field formed by the active shield 2 reduces the magnetic field formed by the main coil 3. This is the same as in the case of the active shield type superconducting magnet described with reference to FIG. 8.

Almost all of the leakage magnetic field of the main coil is absorbed by the self-shield 1, and similarly the leakage magnetic field of the active shield is absorbed by the self-shield 1. Therefore, the amount of magnetic flux which is the difference between the absolute values of the leakage magnetic fields of the main coil 3 and the active shield 2 passes through the self-shield 1 provided outside the active shield 2.

The absolute value of the magnetic moment of the active shield may be made equal to that of the magnetic moment of the main coil 3. In this case, the relation therebetween is equal to that between the main coil 3B and the active coil shield 2B in FIG. 8, and therefore it is unnecessary to use the self-shield 1. In no current flows in the active shield 2, it is equivalent to the case where the active shield 2 is eliminated, similarly as in the case of FIG. 7. As is apparent from the above description, the amount of magnetic flux passing through the self-shield 1 depends on the magnetic moment of the active shield 2, so that the sectional area required for the self-shield 1, that is, the weight thereof depends on the magnetic moment of the active shield 2.

Hence, the dimension and weight of the self-shield 1, and accordingly the weight of the superconducting magnet can be controlled as required by adjusting the magnetic moment of the active shield 2.

It is assumed that the strength of the uniform magnetic field is 0.5 T. If, in this case, the superconducting magnet is so designed that the leakage magnetic field is absorbed only by the self-shield as shown in FIG. 7, then the weight of the superconducting magnet will be about nine (9) tons; and if the superconducting magnet is so designed that the leakage magnetic field is absorbed only by the active shield as shown in FIG. 8, then the weight will be about three (3) tons. About five (5) tons is the weight limit of the superconducting magnet which is calculated from the load limit of the floor of an ordinary building. Therefore, the superconducting magnet which is to be installed on such a floor should meet the following conditions:

(1) It provides the strength and uniformity of the uniform magnetic field.

(2) The strength of the leakage magnetic field is lower than a predetermined limit value.

(3) the weight of the superconducting magnet is not more than five (5) tons.

(4) The quantity in use of superconducting wire is minimized.

These conditions can be satisfied as follows: In application of the invention, first the number of turns and the dimensions of the main coil 3, and the positions and the configurations of the active shield and the self-shield 1 are roughly determined. Under this condition, the following adjustments are carried out. The thickness of a steel material forming the self-shield 1 is so determined that the self-shield 1 is maximum in dimension while satisfying the condition (3); the magnetic moment of the active shield 2 is so determined that the magnetic flux density of the self-shield 1 is such that the condition (2) is satisfied; and the dimensions and the number of turns of the superconducting coils forming the main coil 3 and the active shield 2 are so adjusted that the uniform magnetic fields of the main coil 3 and the active shield 2 meet the condition (1). These adjustments are repeatedly carried out until the above-described conditions are all satisfied.

The more the shield 1 absorbs the leakage magnetic field of the main coil, the more the magnetic moment of the active shield 2; i.e., the number of turns of the superconducting coils thereof can be decreased. A condition essential for minimizing the manufacturing cost of the superconducting magnet is that the absorption of leakage magnetic field by the self-shield is maximized within the weight limit of the superconducting magnet. Therefore, in the case where it is required to provide a superconducting magnet whose weight is limited, the superconducting magnet can be manufactured at the lowest cost according to the invention.

A high magnetic field superconducting magnet should be more uniform in magnetic field than a low magnetic field superconducting magnet. Therefore, the main coil 3 is preferably made up of three pairs of superconducting coils as shown in FIG. 1. The active shield 2 is positioned near the self-shield 1, and because of the provision of the self-shield the magnetic moment of the active shield 2 may be smaller than that in the active shield type superconducting magnet shown in FIG. 8. Accordingly, the effect of the active shield on the uniform magnetic field is small. Therefore, the active shield 2 may be made up of one pair of superconducting coils as shown in FIG. 1. Thus, the construction of the active shield is less limited by the condition of magnetic field uniformity.

The self-shield 1 may be smaller in thickness than that 1A in FIG. 7. Therefore, the construction where the self-shield 1A forms a part of the cryostat as shown in FIG. 1 may be employed as the case may be. In this case, the dimension between the cryostat and the self-shield is eliminated, and therefore the resultant superconducting magnet is more compact.

A concrete example of the superconducting magnet of the invention will be described. The superconducting magnet is provided according to the results of calculations which are performed with a computer assuming that is has the strength of the uniform magnetic field set to 0.5 T.

Figure 2:
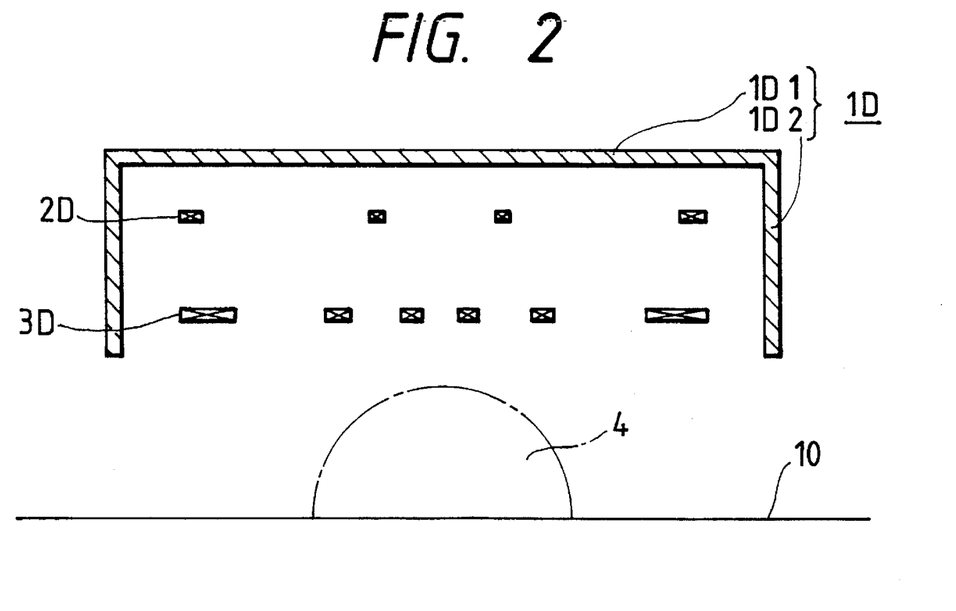
FIG. 2 is a sectional view showing one concrete example of the superconducting magnet according to the invention.

FIG. 2 is a sectional view for showing an arrangement of the superconducting magnet obtained through the computer analysis, which is conducted assuming that the uniform magnetic field is unchanged using actual conditions of installation. In the superconducting magnet, the main coil 3D is made up of three pairs of superconducting coils, and the active shield 2D comprises two pairs of superconducting coils. The self-shield 1D comprises a cylinder 1D1 and flanges 1D2 connected both ends of the cylinder 1D1; that is, it is a flanged self-shield.

The main coil 3D is 500 mm in inner diameter, the active shield 2 is 750 mm in inner diameter, and the cylinder 1D1 of the self-shield 1D is 810 mm in inner diameter. The axial length of the self-shield 1D, that is, the length in the direction of the axis is 1710 mm, and the main coil 3D and the active shield 2D are positioned between the flanges 1D2 of the self-shield 1D. Therefore, the total length of the superconducting magnet is equal to the length of the self-shield 1D. The magnetic moment ratio of the main coil and the active shield is 0.7. The cylinder 1D1 of the self-shield 1D is 30 mm in thickness, and the flanges 1D2 are 400 mm in inner diameter. These dimensions have been calculated under the condition that the main coil 3D and the active shield 2D are made equal in axial length to each other as much as possible.

As shown by the one-dot chain line in FIG. 2, the uniform magnetic field space 4 is in the form of a sphere whose center corresponds to the center of the symmetry axis. The uniformity of the uniform magnetic field is defined as that of the magnetic field in the sphere. The radius of the sphere is generally 350 mm.

Figure 3:
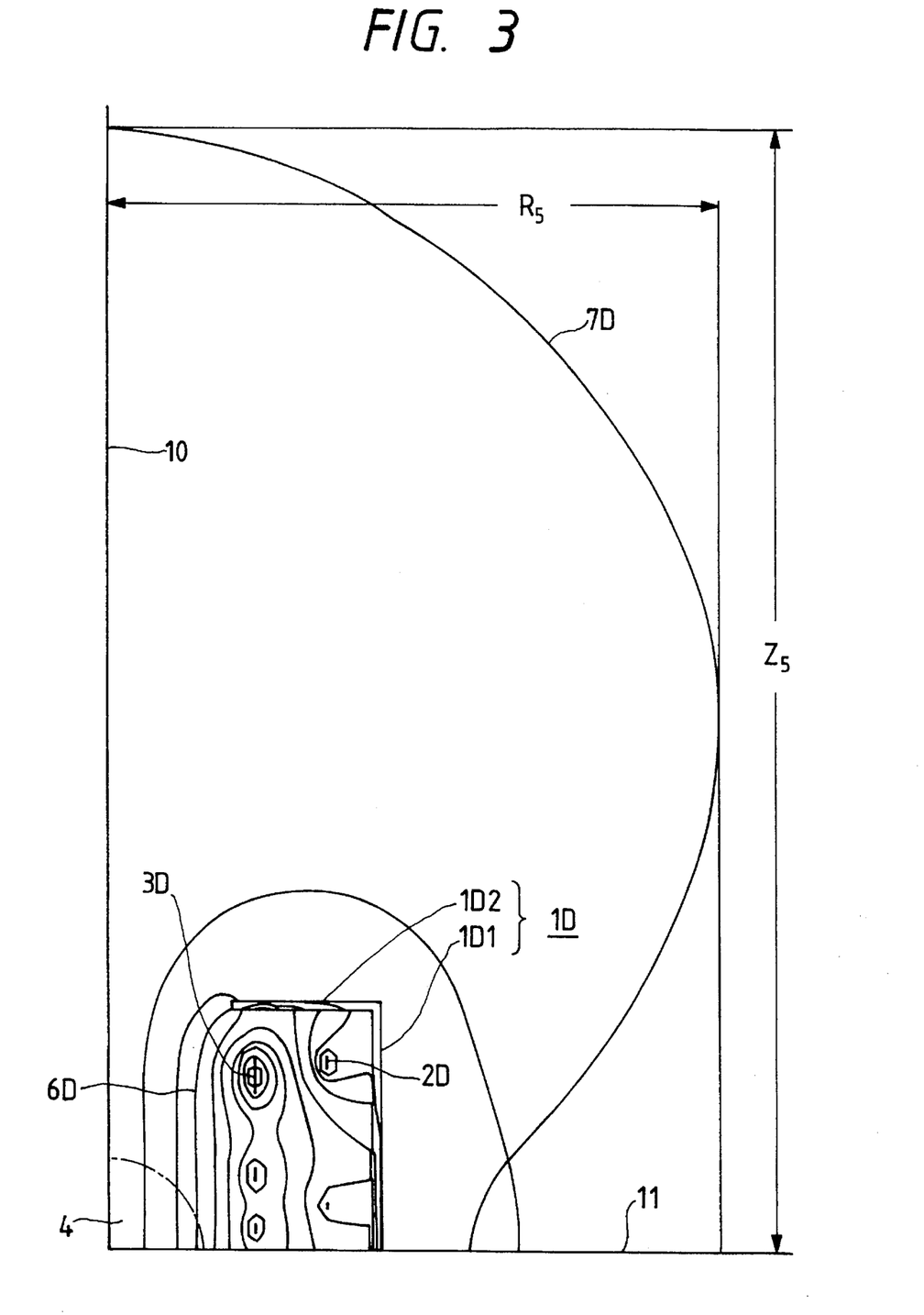
FIG. 3 is a diagram showing the magnetic flux distribution of the superconducting magnet shown in FIG. 2.

FIG. 3 shows the distribution of magnetic flux induced by the superconducting magnet constructed as shown in FIG. 2.

In FIG. 3, the vertical axis is the symmetry axis 10; i.e., the z-axis, and the horizontal axis is the radial axis; i.e., the r-axis 11, and the original point (at the lower left corner) which is the intersection of the z-axis 10 and the r-axis 11 is the center of the uniform magnetic field space. In FIG. 2, the symmetry axis 10 is extended horizontally on the drawing, and therefore FIG. 2, when turned 90° counterclockwise, coincides with FIG. 3.

FIG. 3 shows the upper half of the coaxial cylindrical coordinates system, and accordingly the upper half of the superconducting magnet. That is, FIG. 3 is also a sectional view showing upper portions of the ring coils of three pairs forming the main coil 3D, and upper portions of the ring coils of two pairs forming the active shield 2D, and the upper half of the self-shield 1D.

The magnetic flux lines 6D represent the flow of magnetic flux, and they are so drawn that the direction of a tangent to any one of the magnetic flux lines coincides with the direction of the magnetic flux density at the contact point, and the density thereof at a given point is proportional to the product of the magnetic flux density and the radius thereat. Since the density of the magnetic flux lines 6D is not directly proportional to the magnetic flux density, it is impossible to read from. FIG. 3 the distribution of the absolute values of magnetic flux densities representing magnetic field strength. However, roughly stated, it may be considered that, since the radii of the magnetic flux lines are less variable except for those near the z-axis 10, the density thereof at a given point is substantially proportional to the absolute value of the magnetic flux density thereat. Thus, it can be read from FIG. 3 that the magnetic flux density is higher locally around the ring coils forming the main coil 3D and the active shield 2D.

Figure 4:
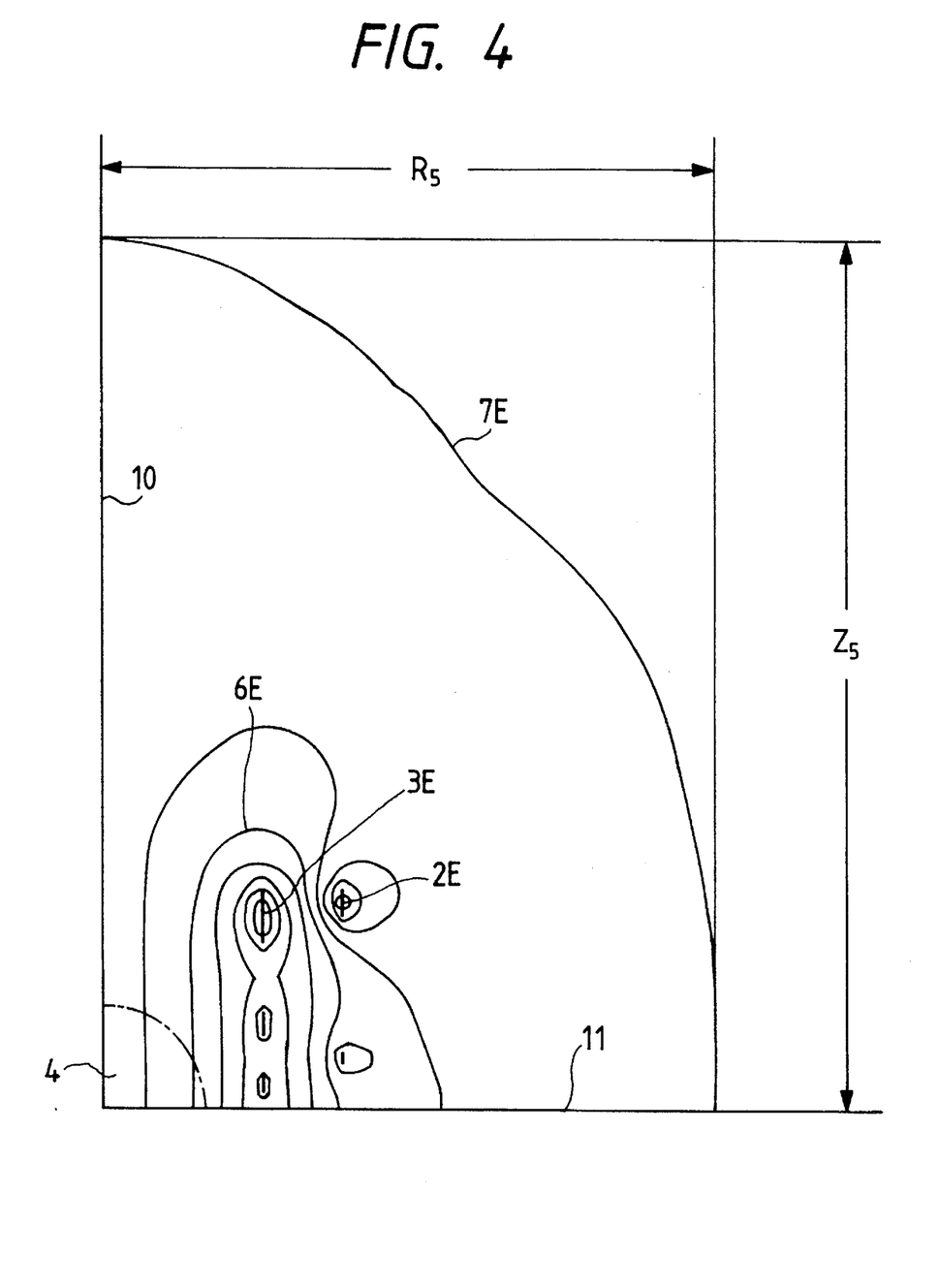
FIG. 4 is a diagram showing the magnetic flux distribution of an active shield type superconducting magnet.

The magnetic flux lines in the uniform magnetic field space 4, defined by the circle indicated by the one-dot chain line, at the lower left corner of FIG. 3 are in parallel with the z-axis 10. This means that the magnetic flux distribution is uniform in the space 4. As is apparent from FIG. 3, the magnetic flux lines passing through the uniform magnetic field space 4 and the magnetic flux lines 6D laid on the right-handed side of the main coil 3D are divided into a group of magnetic flux lines which are absorbed by the self-shield 1D and a group of magnetic flux lines which are extended in the opposite direction between the main coil 3D and the active shield 2D. In the case of the self-shield type superconducting magnet as shown in FIG. 7, almost all of the magnetic flux lines absorbed by the self-shield 1A; and in-the case of the active-shield type superconducting magnet as shown in FIG. 8, almost all of the magnetic flux lines 6E, as shown in FIG. 4 (described later in more detail) are extended in the space between the main coil 3E and the active shield 2E. In the case of FIGS. 2 and 3, both the active shield 2D and the self-shield 1D are provided, and therefore, the magnetic flux lines on the right-handed side of the main coil 3D shows a magnetic flux distribution such that they are divided into a group of magnetic flux lines extended in the space between the main coil 3D and the active shield 2D, and a group of magnetic flux lines extended to the self-shield 1D, as described above.

As is apparent from FIG. 3, the leakage of magnetic flux lines outside the self-shield 1D is much less; the magnetic flux corresponding in strength to the magnetomotive force which is induced in the self shield 1D by the magnetic flux passing therethrough may leak out. This leakage flux decreases its strength as it goes away from the superconducting magnet. In FIG. 3, reference character 7D designates a five-gauss line where the magnetic flux density of the leakage flux becomes five gausses. The range defined by the five-gauss line 7D is 2.06 m in radial dimension $R_s$, and 3.81 m in axial dimension $Z_s$. The rectangle whose sides are twice these dimensions has an area $S_5$ of 31 m². The area $S_5$ is referred to as "a five gauss area" which is an index for indicating the spread of the leakage flux. The value 31 m² cannot be obtained without the provision of a magnetic shield such as the self-shield or active shield. The inside of the five-gauss line 7D is considered as a dangerous zone for a heart disease patient who has a pace maker buried in him. On the other hand, for instance a computer or other equipment may be positioned outside the five gauss line 7D, being free from the effect of leakage flux. In addition, even if a ferromagnetic substance is provided outside the line 7D, it will not substantially affect the magnetic field uniformity.

In the case where the magnetic field component in the uniform magnetic field space 4, which is induced by the superconducting magnet constructed as shown in FIG.2 is expanded in a series according to Legendre's function, the coefficients of the terms of respective order are indicated in the following table as the ratios thereof to the uniform magnetic field component having the order of "0". In the table, the data for the order higher than "12" are not listed; and the values of the order components of the orders other than that of the order of "12" are rounded to the nearest whole numbers.

Table

| Order | B3 (6210) | B2 (1571) | B1 (361) | B (5000) (Unit: ppm) |
|---|---|---|---|---|
| 2 | −5910 | −1287 | 4624 | 0 |
| 4 | −123 | −80 | 43 | 0 |
| 6 | 2 | 13 | −15 | 0 |
| 8 | 0 | 1 | −1 | 0 |
| 10 | 0 | 0 | 0 | 0 |
| 12 | −1.6 | 0.0 | 0.0 | −1.6 |

In the table, reference characters B3, B2, and B1 represent the magnetic fields induced by the main coil 1, the active shield 2, and the self-shield 1, respectively; and B, the composite magnetic field of these magnetic fields in the actual uniform magnetic field space. Further in the table, the data parenthesized represents the magnetic flux densities of the uniform magnetic field components in gauss units which are the magnetic field strengths of the order of "0". The data listed for the order of "2" to "12" are the ratios in ppm (10−6) to the 5000 gausses which is the uniform magnetic field component of the composite magnetic field B.

Since, as described above, the main coil 3 is made up of three ring coils, theoretically the components of the five orders, from "2" to "10", can be set to zero (0). Furthermore, since the superconducting magnet is so designed that its structure is symmetrical with respect to horizontal plane perpendicular to the z-axis, the components of odd-numbered order are not produced. In the example, it has been proved that the magnetic field components of up to the order of "10" can be zero as stated theoretically; however, sometimes, depending on the arrangement of the active shield 2D or the self-shield 1D, the best condition for eliminating the magnetic field components of up to the order of "10" by adjusting the ampere turn or position of each of the ring coils of the main coil 3D may not be obtained, and the adjustment may not be practical because of other factors. In addition, under different conditions, the five-gauss area $S_5$ is sometimes so large that the superconducting magnet is not practical in use. In the concrete example described above, the self-shield 1D has the flanges 1D2. In order to simplify the structure of the self-shield 1D, thereby to decrease the manufacturing cost, the flanges 1D2 may be eliminated. However, it has been determined through calculation that the superconducting magnet whose self-shield has no flanges formed is much larger in the five gauss area than the superconducting magnet whose self-shield has the flanges, and it is not practical in use. The embodiment described with reference to FIGS. 2 and 3 is one of the superconducting magnets which have shown the best of the results of calculation made under various conditions.

FIG. 4 is a diagram showing the magnetic flux distribution of the active shield type superconducting magnet as shown in FIG. 8 and the five-gauss line thereof, and is provided for comparison with FIG. 3. In the case of FIG. 4, the magnetic flux distribution is such that all the magnetic flux lines 6E on the right-handed side of the main coil 3E are extended between the main coil 3E and the active shield 2E. The five-gauss line 7E is 1.92 m in radial dimension $R_s$, 2.71 m in axial dimension $Z_s$, and 21 m² in five-gauss area. The values of the components of the respective orders in this case, are listed in the following table, corresponding to the above-described table Table

| Degree | B3 (7878) | B1 (2878) | B (5000) (Unit: ppm) |
|---|---|---|---|
| 2 | −2316 | 2316 | 0 |
| 4 | −146 | 146 | 0 |
| 6 | 24 | −24 | 0 |
| 8 | 3 | −3 | 0 |
| 10 | 0 | 0 | 0 |
| 12 | −2.0 | 0.0 | −2.0 |

Figure 5:
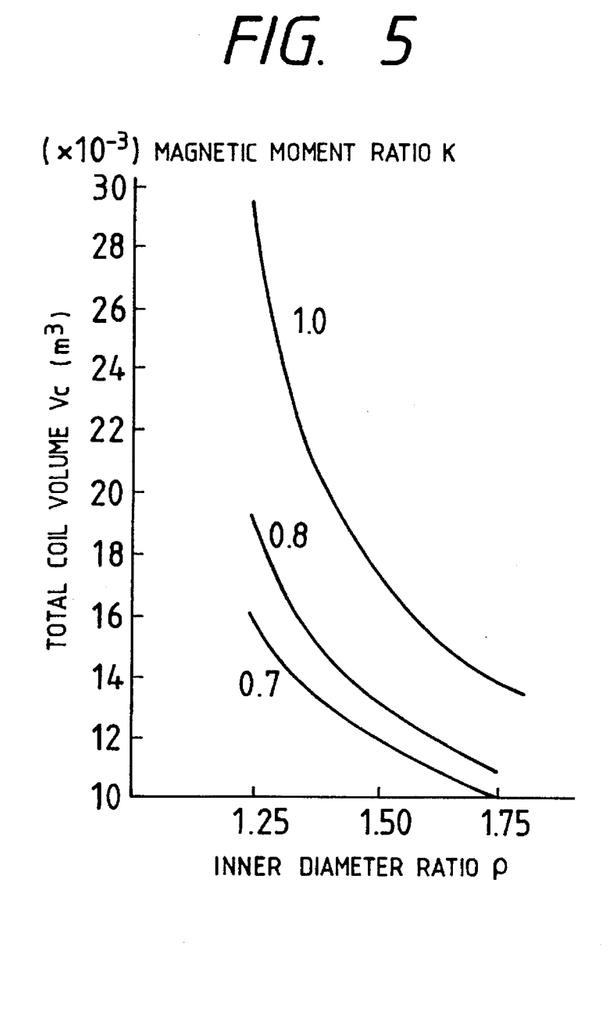
FIG. 5 is a graphical representation indicating coil inside diameter with total coil volume.

FIG. 5 is a graphical representation indicating relationships between inner diameter ratios ρ which are the ratios of main coil inner diameters to active shield inner diameters, and total coil volumes which are the total volumes of the superconducting coils forming the main coils and the active shields. In FIG. 5, the horizontal axis represents the inner diameter ratios, and the vertical axis the total coil volumes, with the magnetic moment ratios K of the main coils and the active shields as parameters. In the example described with reference to FIGS. 2 and 3, the inner diameter ratio ρ is 1.5. In FIG. 5, the magnetic moment ratios K provided for the inner diameter ratios between 1.25 (smaller than 1.5) and 1.75 (larger than 1.5) are shown. As is apparent from the graphical representation, as the inner diameter ratio ρ increases, the total coil volume is decreased; and the total coil volume Vc decreases with the magnetic moment ratio. For instance, the total coil volume with magnetic moment ratio of 0.7 is smaller by about 10% than that with magnetic moment ratio of 0.8.

The total coil volume Vc represents the quantity of superconducting wire used. Therefore, the quantity of superconducting wire, which is expensive, can be decreased by decreasing the total coil volume Vc. FIG. 5 has been prepared by computation with the current density of the superconducting wire maintained unchanged independently of the magnetic moment ratio K. However, it should be noted that, in practice, the maximum magnetic flux density at the position of the superconducting wire is increased as the magnetic moment ratio K comes closer to 1.0, and the superconducting wire has its inherent characteristic that, the larger the maximum magnetic flux density, the smaller superconducting critical current. Therefore, in the case where the maximum magnetic flux density is large as described above, it is necessary to decrease the current density of the superconducting wire. For instance, the current density in the case of FIG. 5 where the magnetic moment ratio is 0.7, can be made 1.3 times as large as that in the case of FIG. 4 where only the active shield is employed and the magnetic moment ratio is 1.0. Therefore, in the invention using the self-shield in addition to the active shield, the total coil volume Vc can be decreased much more than in the case of FIG. 5. For instance, in the case where $\rho$ is 1.5 in FIG. 5, the total coil volume with the magnetic moment ratio of 0.7 is 68% of the total coil volume with the magnetic moment ratio of 1.0; however, the percentage will be 52% when the above-described difference in current density is taken into account.

Figure 6:
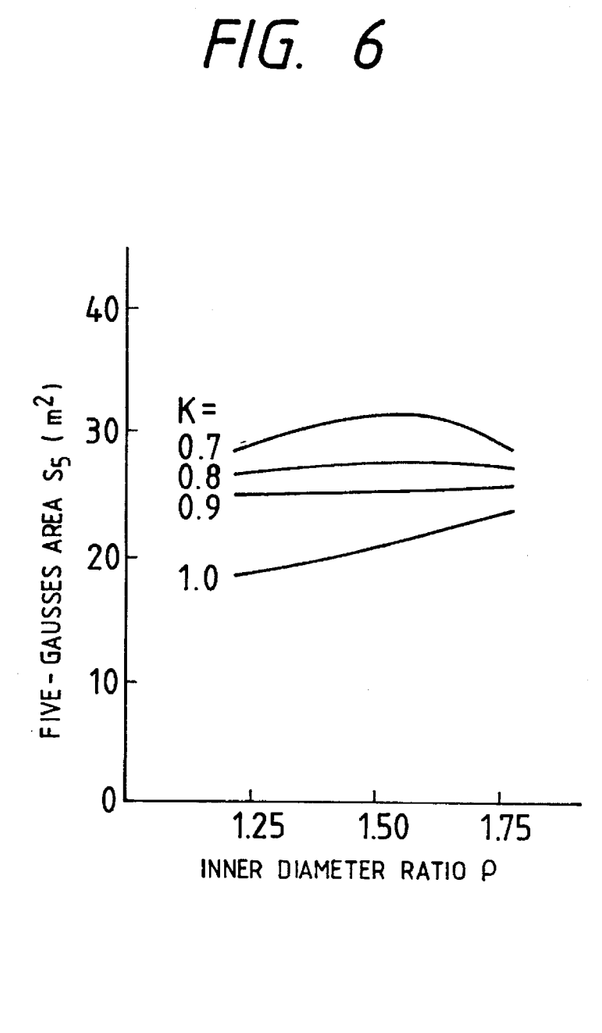
FIG. 6 is also a graphical representation indicating coil inside diameter with five-gauss area.

FIG. 6 is a graphical representation indicating inner diameter ratios $\rho$ with five-gauss areas $S_5$. In FIG. 6, the horizontal axis, similarly as in FIG. 5, represents the inner diameter ratios $\rho$, and the vertical axis the five-gauss areas, with magnetic moment ratios K as parameter. As is apparent from FIG. 6, as the magnetic moment ratio K decreases, the five-gauss area $S_5$ is increased. Therefore, in the superconducting magnet of the invention in which, with the magnetic moment ratio K set to less than 1.0, the self-shield is provided, the five-gauss area $S_5$ is larger than that in-the active shield type superconducting magnet. However, it should be noted that this drawback means the necessity of designing the self-shield so that the five-gauss area be smaller than actually required, because it can be improved by increasing the thickness of the ferromagnetic material forming the self-shield so as to decrease the magnetic field density in the self-shield; that is, it is not a theoretical drawback of the invention.

As described above, in the superconducting magnet of the invention, the se;-shield and the active shield are employed in combination, and because the weight of the superconducting magnet can be changed by adjusting the percentage of absorbing or cancelling the leakage magnetic field of the main coil, and because the cost of a superconducting magnet depends on the quantity in use of expensive superconducting wire, the amount of leakage flux absorbed by the self-shield is increased with the limit weight of the superconducting magnet maintained unaffected, and the remaining leakage flux is cancelled out by the active shield. Therefore, the superconducting magnet of the invention is small in the quantity of superconducting wire with the weight limit unchanged, and accordingly minimum in manufacturing cost.

What is claimed is:

1. A superconducting magnet for producing uniform magnetic field, comprising:

a main coil comprising first superconducting coils;

an active shield comprising second superconducting coils and arranged in such a manner as to coaxially surround said main coil; and a self-shield comprising magnetic material and arranged in such a manner as to coaxially surround said active shield, the magnetic moment of said active shield being smaller in absolute value than and opposite in direction to the magnetic moment of said main coil.

2. A superconducting magnet as claimed in claim 1, wherein said first superconducting coils are arranged symmetrically with axis.

3. A superconducting magnet as claimed in claim 1, wherein said self-shield is in a cylinder form.

4. A superconducting magnet as claimed in claim 1, said superconducting magnet further comprising a cryostat for accommodating said first and second superconducting coils.

5. A superconducting magnet as claimed in claim 4, wherein a part of said cryostat comprises said self-shield.

6. A superconducting magnet as claimed in claim 1, wherein said main coil comprises three pairs of ring coils.

* * * * *